(12) United States Patent
Gu et al.

(10) Patent No.: US 11,785,860 B2
(45) Date of Patent: Oct. 10, 2023

(54) TOP ELECTRODE FOR A MEMORY DEVICE AND METHODS OF MAKING SUCH A MEMORY DEVICE

(71) Applicant: GLOBALFOUNDRIES U.S. Inc., Santa Clara, CA (US)

(72) Inventors: Sipeng Gu, Clifton Park, NY (US); Haiting Wang, Clifton Park, NY (US); Yanping Shen, Saratoga Springs, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 359 days.

(21) Appl. No.: 16/846,497

(22) Filed: Apr. 13, 2020

(65) Prior Publication Data

US 2021/0320244 A1   Oct. 14, 2021

(51) Int. Cl.

| | | |
|---|---|---|
| *H10N 50/80* | (2023.01) | |
| *H10B 51/30* | (2023.01) | |
| *H10B 53/30* | (2023.01) | |
| *H10B 61/00* | (2023.01) | |
| *H10B 63/00* | (2023.01) | |
| *H10N 50/01* | (2023.01) | |
| *H10N 50/10* | (2023.01) | |

(Continued)

(52) U.S. Cl.
CPC ............. *H10N 50/80* (2023.02); *H10B 51/30* (2023.02); *H10B 53/30* (2023.02); *H10B 61/00* (2023.02); *H10B 63/00* (2023.02); *H10N 50/01* (2023.02); *H10N 50/10* (2023.02); *H10N 70/011* (2023.02); *H10N 70/231* (2023.02); *H10N 70/841* (2023.02)

(58) Field of Classification Search
CPC . H01L 27/11502–11514; H01L 27/222; H01L 27/2463–249; H01L 43/08; H01L 45/06–1691; H01L 45/1253; H01L 45/1233–124; H10N 70/841; H10N 70/826–8265; H10N 50/10; H10N 70/061–068; H10N 70/20–8845; H10B 53/00–53/50; H10B 61/00; H10B 63/80–845

See application file for complete search history.

(56) References Cited

U.S. PATENT DOCUMENTS

| | | | |
|---|---|---|---|
| 9,653,682 B1 * | 5/2017 | Chou | ............ H01L 45/16 |
| 2007/0172964 A1 | 7/2007 | Yen et al. | |
| 2009/0091038 A1 | 4/2009 | Chen et al. | |

(Continued)

OTHER PUBLICATIONS

Kozicki and Barnaby, "Conductive bridging random access memory—materials, devices and applications," Semicond. Sci. Technol., 31:113001, 2016.

(Continued)

*Primary Examiner* — Kevin Parendo
(74) *Attorney, Agent, or Firm* — Yee Tze Lim; Hoffman Warnick LLC

(57) ABSTRACT

One illustrative device disclosed herein includes a memory cell positioned in a first opening in at least one layer of insulating material. The memory cell comprises a bottom electrode, a memory state material positioned above the bottom electrode and an internal sidewall spacer positioned within the first opening, wherein the internal sidewall spacer defines a spacer opening. The device also comprises a top electrode positioned within the spacer opening.

20 Claims, 11 Drawing Sheets

(51) Int. Cl.
   *H10N 70/00*    (2023.01)
   *H10N 70/20*    (2023.01)

(56) References Cited

U.S. PATENT DOCUMENTS

| | | | |
|---|---|---|---|
| 2009/0261433 A1 | 10/2009 | Kang et al. | |
| 2009/0278109 A1* | 11/2009 | Phatak | H01L 45/1233 |
| | | | 257/E47.001 |
| 2010/0181549 A1* | 7/2010 | Kim | H01L 27/2409 |
| | | | 257/E47.001 |
| 2012/0032287 A1 | 2/2012 | Li et al. | |
| 2014/0131651 A1 | 5/2014 | Tu et al. | |
| 2015/0171314 A1 | 6/2015 | Li et al. | |
| 2015/0255718 A1* | 9/2015 | Liu | H01L 27/2436 |
| | | | 257/4 |
| 2016/0093668 A1 | 3/2016 | Lu et al. | |
| 2016/0133828 A1 | 5/2016 | Lu et al. | |
| 2016/0218283 A1* | 7/2016 | Trinh | H01L 45/146 |
| 2016/0380183 A1* | 12/2016 | Chuang | H01L 43/08 |
| | | | 257/421 |
| 2017/0117467 A1* | 4/2017 | Chang | H01L 45/1675 |
| 2019/0044065 A1* | 2/2019 | Tseng | H01L 45/1691 |
| 2019/0067373 A1* | 2/2019 | Yang | H01L 45/1233 |
| 2021/0135105 A1* | 5/2021 | Chen | H01L 45/08 |

OTHER PUBLICATIONS

Li et al., "An overview of resistive random access memory devices," Chinese Science Bulletin, 56:3072-78, Oct. 2011.

\* cited by examiner

TOP ELECTRODE FOR A MEMORY DEVICE AND METHODS OF MAKING SUCH A MEMORY DEVICE

BACKGROUND OF THE INVENTION

Field of the Invention

The present disclosure generally relates to the fabrication of integrated circuits, and, more particularly, to various novel embodiments of a conductive top electrode for a memory device and various novel methods of making such a memory device.

Description of the Related Art

In many modern integrated circuit products, embedded memory devices and logic circuits (e.g., microprocessors) are formed on the same substrate or chip. Such embedded memory devices may come in a variety of forms, e.g., an MTJ (magnetic tunnel junction) memory device, an RRAM (resistive random access memory) device, a PRAM (phase-change random access memory) device, an MRAM (magnetic random access memory) device, a FRAM (ferroelectric random access memory) device, etc. Typically, all of the embedded memory devices have a top electrode to which a conductive contact structure must be formed for the device to be operational.

Various techniques have been employed to try to form such a conductive contact structure to the top electrode of such a memory device. Typically, after the top electrode is formed, it is covered by a layer of insulating material. At some point later in the process flow, the upper surface of the top electrode must be exposed to allow for formation of the conductive contact structure. One technique involves etching a trench into the layer of insulating material so as to expose or "reveal" the top electrode. This necessitates that the bottom of the trench extends past the upper surface of the top electrode. One problem with this technique is that it typically requires that the top electrode be made relatively thicker so as to provide an increased process window and reduce the chances of the trench exposing other parts of the memory device, leading to the creation of an undesirable electrical short that would render the memory device inoperable. Another manufacturing technique that is commonly employed involves directly patterning (via masking and etching) a via that is positioned and aligned so as to expose the upper surface of the top electrode. One problem with this approach is the fact that, as device dimensions continue to shrink, it is very difficult to properly align the via such that it only exposes a portion of the upper surface of the top electrode. Any misalignment of the via relative to the top electrode can result in undesirable exposure of the sidewalls of the top electrode, which can also lead to undesirable electrical shorts and device inoperability. Additionally, these processing steps lead to higher manufacturing costs and require the use of additional masking layers.

The present disclosure is generally directed to various novel methods of forming a conductive contact structure to a top electrode of an embedded memory device on an integrated circuit (IC) product and a corresponding IC product that may at least reduce one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel embodiments of a conductive top electrode for a memory device and various novel methods of making such a memory device. One illustrative device disclosed herein includes at least one layer of insulating material and a memory cell positioned in a first opening in the at least one layer of insulating material. The memory cell comprises a bottom electrode, a memory state material positioned above the bottom electrode and an internal sidewall spacer positioned within the first opening, wherein the internal sidewall spacer defines a spacer opening. In this example, the device also comprises a top electrode positioned within the spacer opening and above a portion of the memory state material.

One illustrative method disclosed herein includes forming a stack of materials for a memory cell, the stack of materials comprising a bottom electrode and a memory state material positioned above the bottom electrode, forming at least one first layer of insulating material around the stack of materials and forming a cavity in the at least one first layer of insulating material above at least a portion of the stack of materials. In this example, the method also includes forming an internal sidewall spacer within the cavity above at least a portion of the stack of materials, the internal sidewall spacer defining a spacer opening and forming a top electrode within the spacer opening and above a portion of the stack of materials.

BRIEF DESCRIPTION OF THE DRAWINGS

The disclosure may be understood by reference to the following description taken in conjunction with the accompanying drawings, in which like reference numerals identify like elements, and in which.

Figure 1:
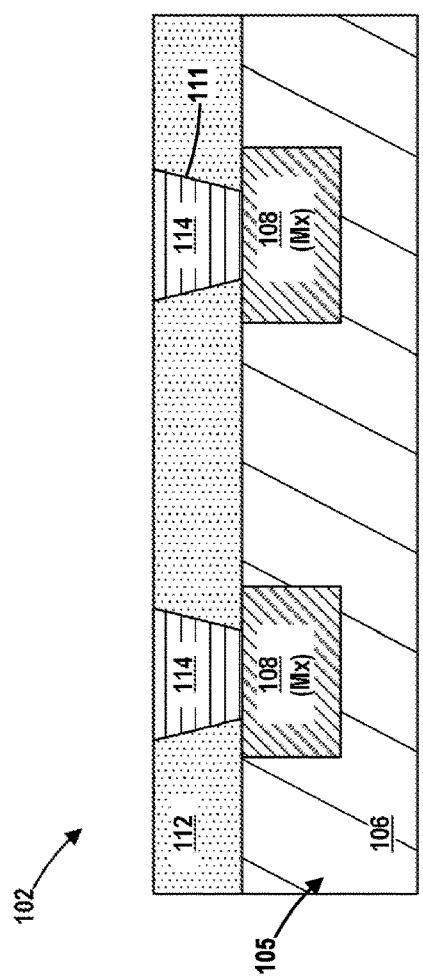
FIGS. 1-11 depict various novel embodiments of a conductive top electrode for a memory device and various novel methods of making such a memory device. The drawings are not to scale.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the presently disclosed structures and method may be applicable to a variety of products, stand-alone memory products, embedded memory products, etc. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIGS. 1-11 depict various novel embodiments of an integrated circuit product 100 comprising a conductive top electrode for a memory device and various novel methods of making such a memory device. The IC product 100 will be formed on and above a semiconductor substrate (not shown). The semiconductor substrate may have a variety of configurations, such as a bulk silicon configuration. The substrate may also have a semiconductor-on-insulator (SOI) configuration that includes a base semiconductor layer, a buried insulation layer and an active semiconductor layer positioned above the buried insulation layer, wherein transistor devices (not shown) that are formed on the substrate are formed in and above the active semiconductor layer. The substrate may be made of silicon or it may be made of materials other than silicon. Thus, the terms "substrate" or "semiconductor substrate" should be understood to cover all semiconducting materials and all forms of such materials.

In general, and with reference to FIG. 1, the IC product 100 comprises a memory region 102 where one or more memory devices will be formed and a logic region 104 where one or more logic circuits (e.g., microprocessor circuits) will be formed in and above a semiconductor substrate (not shown in the attached figures). As is typical, the IC product 100 includes a plurality of metallization layers that constitute the overall wiring pattern for the IC product 100. These metallization layers may be formed on the IC product 100 by performing traditional manufacturing processes. These metallization layers are typically comprised of layers of insulating material (e.g., silicon dioxide) with a plurality of conductive metal lines and/or conductive vias formed in the layers of material. The conductive metal lines are routed across the substrate in various patterns and arrangements and provide the means for intra-layer electrical communication between the devices and structures formed on or above the substrate. The conductive vias provide the means for allowing electrical communication between the conductive metal lines in adjacent metallization layers. The first metallization layer of an IC product is typically referred to as the "M1" layer (or in some cases the "M0" layer), while the conductive vias that are used to establish electrical connection between the M1 layer and the conductive lines in the immediately adjacent upper metallization layer (the "M2 layer) are typically referred to as "V1" vias. So-called device level contacts (not shown) are formed above the substrate so as to provide electrical communication between the various devices, e.g., transistors, resistors, etc., that are formed on or immediately adjacent the semiconductor substrate.

FIG. 1 depicts the IC product 100 after several process operations were formed. More specifically, FIG. 1 depicts the product 100 at a point in time wherein an illustrative (and representative) metallization layer 105 has been formed above the semiconductor substrate (not shown). As will be appreciated by those skilled in the art after a complete reading of the present application, the metallization layer 105 is intended to be representative of any metallization layer that may be formed on the IC product 100 irrespective of its location relative to an upper surface of the semiconductor substrate or any of the other metallization layers formed on the IC product 100.

With continued reference to FIG. 1, the product 100 is depicted at a point in time where a layer of insulating material 106, e.g., silicon dioxide, for a representative metallization layer—Mx—of the IC product 100 has been formed above the semiconductor substrate. As noted above the Mx metallization layer is intended to be representative of any metallization layer formed at any level on the IC product 100. In the example shown in FIG. 1, various illustrative conductive metal lines 108 have been formed in the layer of insulating material 106 in both the memory region 102 and the logic region 104. The number, size, shape, configuration and overall routing of the metal lines 108 may vary depending upon the particular application. In one example, the conductive metal lines 108 are elongated features that extend across the product 100 in a direction that is transverse to the plane of the drawing in FIG. 1. The metal lines 108 may be comprised of any of a variety of different conductive materials, e.g., copper, aluminum, tungsten, etc., and they may be formed by traditional manufacturing techniques, e.g., by performing a damascene process for cases where the conductive lines 108 are made of copper and perhaps by performing traditional deposition and etching processes when the conductive lines 108 are made of a conductive material that may readily be patterned using traditional masking and patterning (e.g., etching) techniques.

Also depicted in FIG. 1 is a layer of insulating material 112 that was blanket-deposited on the IC product 100. If desired, a planarization process may be performed on the layer of insulating material 112 to substantially planarize its upper surface. The layer of insulating material 112 is representative in nature is that it may represent a single layer of material or multiple layers of material. The single or multiple layers of insulating material 112 may be comprised of a variety of different insulating materials, e.g., silicon carbon nitride (SiCN), SiN, Al$_2$O$_3$, HfO$_x$, SiO$_2$, SiON, SiOCN, etc., and its vertical thickness may vary depending upon the particular application.

Next, a patterned etch mask (not shown) was formed on the IC product 100. This particular patterned etch mask covers the logic region 104 but exposes portions of the layer of insulating material 112 at locations in the memory region 102 where it is desired to establish electrical contact with the conductive lines 108 formed in the layer of insulating material 106 within the memory region 102. At that point, an etching process was performed through the patterned etch mask (not shown) so as to remove exposed portions of the layer of insulating material 112 in the memory region 102. This etching process operation results in the formation of overall contact openings 111 that extend through the layer of insulating material 112 and thereby expose at least portion of the upper surface of the conductive lines 108 in the memory region 102. At that point, the patterned etch mask may be removed. Then, a conductive via 114 was formed in each of the openings 111 by performing traditional manufacturing processing techniques, e.g., by performing a deposition process so as to overfill the openings 111 in the memory region 102 with conductive material(s), followed by performing a chemical mechanical planarization (CMP) process operation and/or a dry etch-back process to remove the excess amounts of the conductive material for the conductive vias 114 that are positioned on or above the upper surface of the layer of insulating material 112. In one illustrative embodiment, when viewed from above, the conductive vias 114 may have a substantially circular configuration. In other situations, the conductive vias 114 may have a substantially oval configuration. The vertical thickness of the illustrative vias 114 may vary depending upon the particular application, and they may be comprised of a variety of conductive materials, e.g., copper, tungsten, aluminum, TiN, TaN, etc. The conductive vias 114 may be comprised of the same material of construction as that of the conductive metal line 108 to which it is conductively coupled, but that may not be the case in all applications. Of course, as will be appreciated by those skilled in the art after a complete reading of the present application, various barrier layers or liner layers (neither of which is shown) may be formed as part of the process of forming the illustrative conductive lines 108 and the conductive vias 114. Moreover, various additional conductive structures that will be formed on the IC product 100, as discussed more fully below, may or may not include such illustrative barrier layers and/or liner layers, which are not depicted so as to not overly complicate the attached drawings.

As will be appreciated by those skilled in the art after a complete reading of the present application, the present disclosure is directed to the formation of a conductive top electrode for a memory cell 125, as described more fully below. The memory cell 125 depicted herein is intended to be generic and representative in nature. By way of example only, and not by way of limitation, the generic memory cells 125 depicted herein may take a variety of forms, have a variety of different configurations and may comprise different materials. For example, the memory cells 125 depicted herein may be an RRAM (resistive random access memory) device, an MTJ (magnetic tunnel junction) memory device, an RRAM (resistive random access memory) device, a PRAM (phase-change random access memory) device, an MRAM (magnetic random access memory) device, a FRAM (ferroelectric random access memory) device, etc. Such a memory cell 125 includes some form of a memory state material 118 that is typically positioned between a bottom electrode and a top electrode, e.g., the switching layer in an RRAM device. In some applications, some characteristic of the memory state material 118, e.g., resistivity, may be altered by the application of an electrical charge to the memory device 125, and these altered states may be representative of a logical "1" or a logical "0" in a digital circuit. In some situations, the memory state material 118 may actually store an electrical charge. In any event, sensing circuitry on the IC product 100 may be used to sense the state of the memory state material 118, to determine whether or not a particular memory cell 125 represents a logical "1" or a logical "0" and use that information within the various circuits on the IC product 100. The particular materials used for the memory state material 118 may vary depending upon the particular type of memory device that is fabricated. Moreover, the single layer of memory state material 118 depicted in the drawings is intended to be representative in that, in a real-world device, the memory state material 118 may comprise a plurality of layers of material. Thus, the reference to any "memory state material" in the specification and in the attached claims should be understood to cover any form of any material(s) that may be employed on any form of a memory device that can be manipulated or changed so as to reflect two opposite logical states of the memory device. For purposes of disclosing the subject matter herein, the memory cell 125 will be depicted as being an RRAM device, but the presently disclosed subject matter should not be considered to be limited to RRAM devices.

Figure 2:
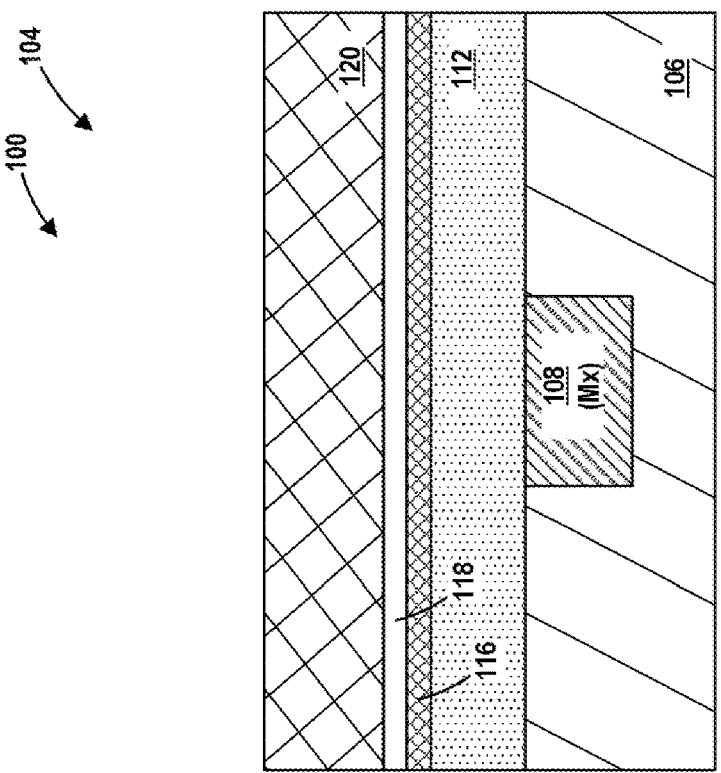
Figure 2:
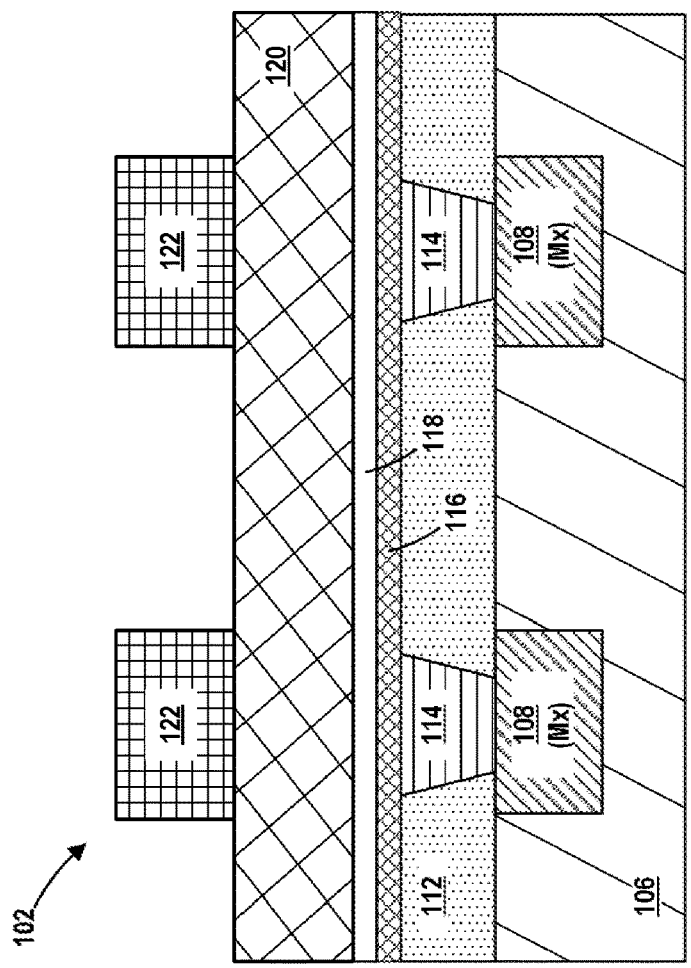

FIG. 2 depicts the IC product 100 after several process operations were performed. First, a first layer of conductive material 116 was formed above the layer of insulating material 112 such that it conductively contacts the conductive vias 114. The first layer of conductive material 116 may be formed to any desired thickness and it may comprise any conductive material, e.g., copper, tungsten, ruthenium, aluminum, Ta, Ti, TaN, TiN, etc. As will be appreciated by those skilled in the art after a complete reading of the present application, a portion of the first layer of conductive material 116 will become the bottom electrode for each of the memory cells 125 disclosed herein. Thereafter, a layer of memory state material 118 was formed above the first layer of conductive material 116. The layer of memory state material 118 may be formed to any desired thickness and it may comprise any of a variety of different materials, e.g., stoichiometric ZrO$_2$, ZnO, HfO$_2$, a doped metal oxide, phase-change chalcoenides (GeSbTe, AgInSbTe), binary transition metal oxide (NiO or TiN), perovskites (e.g., SrTiO$_3$), solid-state electrolytes (GeS, GeSe, SiO$_x$), organic chart-transfer complexes (CuTCNQ), organic donor-acceptor systems (AlDCN), two dimension insulating materials (e.g., boron nitride), etc. Next, a sacrificial layer of material 120 was formed above the memory state material 118. The sacrificial layer of material 120 may be formed to any desired thickness and it may comprise any of a variety of different materials, e.g., amorphous silicon, amorphous carbon, SiO2, SOH, SiON, SiOCN, etc. In some applications, a chemical mechanical planarization (CMP) process operation and/or a dry etch-back process may be performed to planarize the upper surface of the sacrificial layer of material 120. At that point, a patterned etch mask 122 was formed above the sacrificial layer of material 120. The patterned etch mask 122 exposes portions of the memory region 102 and all of the logic region 104. The patterned etch mask 122 may be made by performing known manufacturing techniques and it may be comprised of a variety of different materials, e.g., photoresist, organic planarization layer (OPL), silicon nitride, silicon dioxide, SiON, etc.

Figure 3:
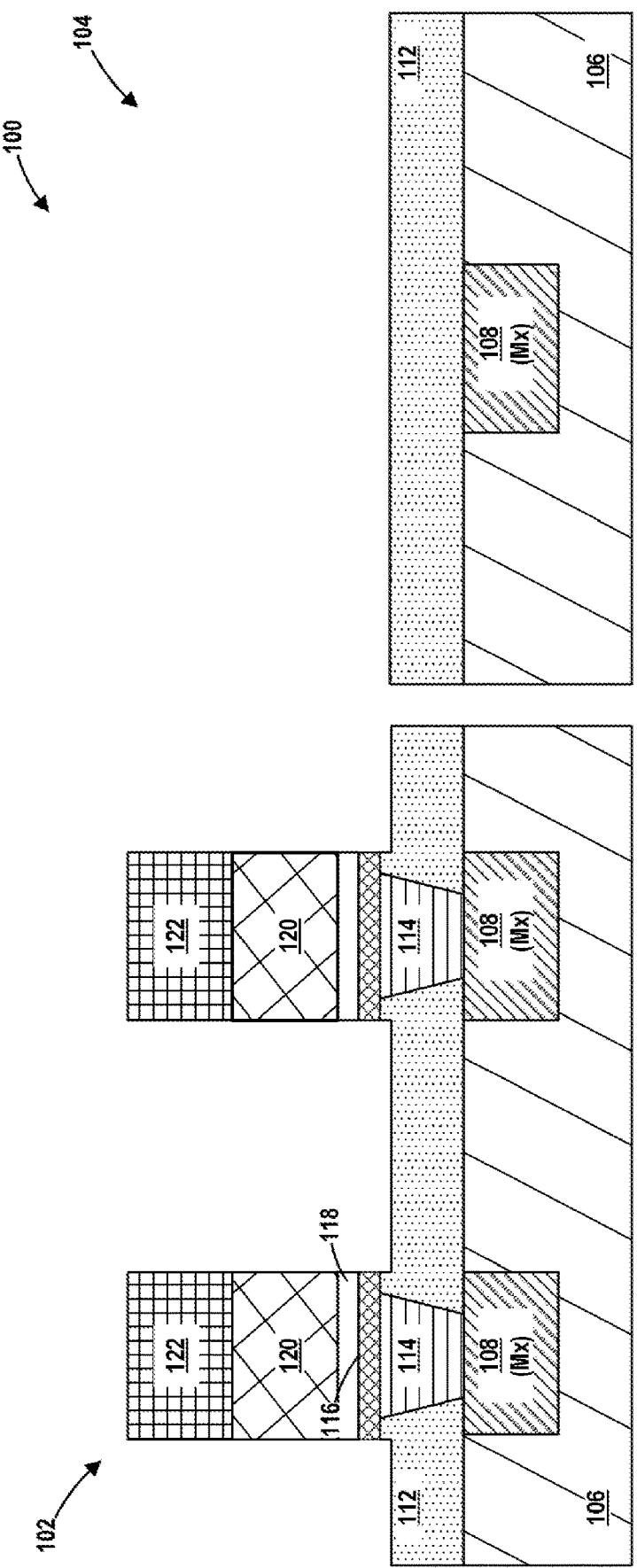

FIG. 3 depicts the IC product 100 after one or more etching processes were performed to remove exposed portions of the sacrificial layer of material 120, the layer of memory state material 118 and the first layer of conductive material 116 so as to form a stack of materials for the memory cells 125 that will be formed using the methods disclosed herein. Note that, during these etching processes, the layer of insulating material 112 may be slightly recessed. As will be appreciated by those skilled in the art after a complete reading of the present application, the patterned portions of the sacrificial layer of material 120 are dummy or sacrificial placeholders for the area or volume where a top electrode 130 (described below) and an internal sidewall spacer 128S (described below) will be formed after the patterned portions of the sacrificial layer of material 120 are removed.

Figure 4:
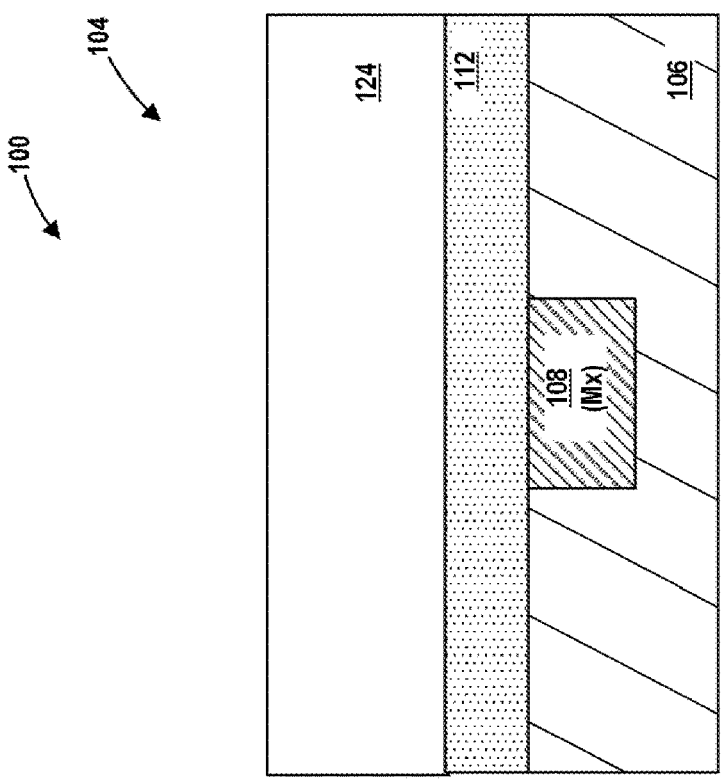
Figure 4:
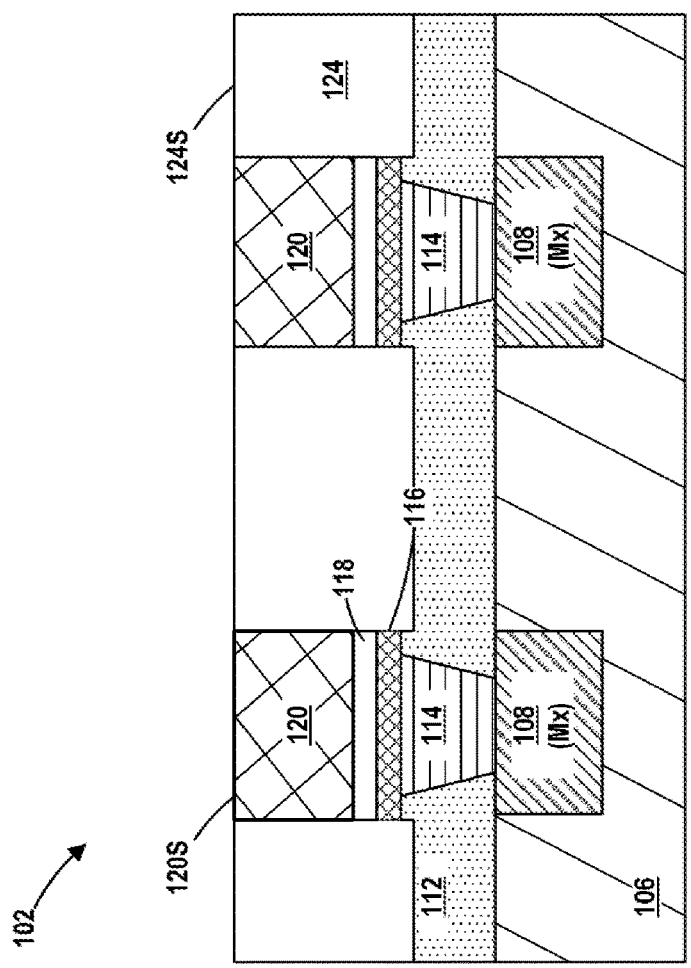

FIG. 4 depicts the IC product 100 after several process operations were performed. First, the patterned etch mask 122 was removed. Thereafter, a layer of material 124 was formed in both the memory region 102 and the logic region 104. As initially formed, the layer of material 124 may overfill the spaces between the regions of the patterned material layers 120/118/116. At that point, a CMP process may be performed to remove a portion of the layer of material 124 until such time as the upper surface 124S is substantially coplanar with the upper surface 120S of the sacrificial layer of material 120. As depicted, this process operation exposes the portions of the sacrificial layer of material 120 in the memory region 102 for further processing. The layer of material 124 may be initially formed to any desired thickness. The layer of material 124 should be made of a material that exhibits good etch selectivity to the material of the sacrificial layer of material 120. In general, the layer of material 124 may be comprised of any of a variety of different materials, e.g., amorphous carbon, SOH, SiOC, SiOCN, silicon dioxide, etc.

Figure 5:
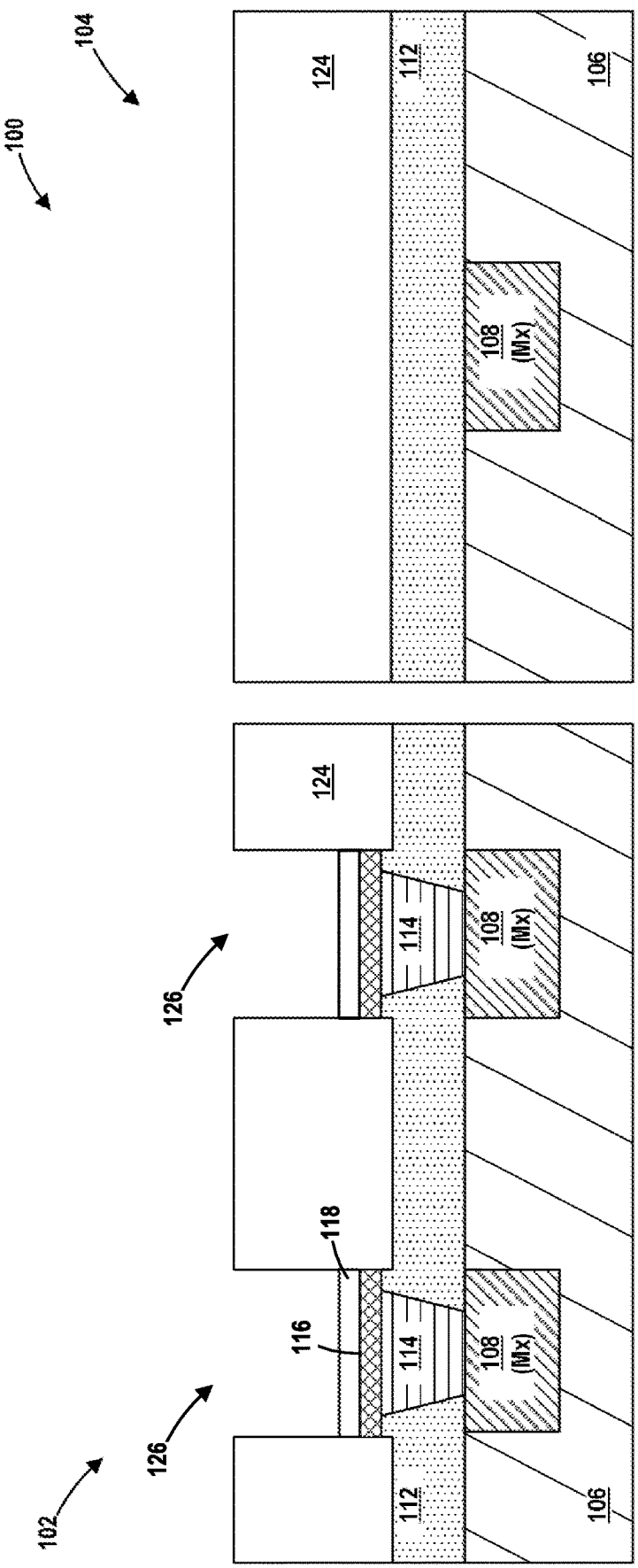

FIG. 5 depicts the IC product 100 after one or more etching processes were performed to remove the exposed portions of the sacrificial layer of material 120 selectively relative to the surrounding materials. These process operations result in the formation of a cavity 126 in the layer of material 124 above the regions of memory state material 118 in the memory region 102.

Figure 6:
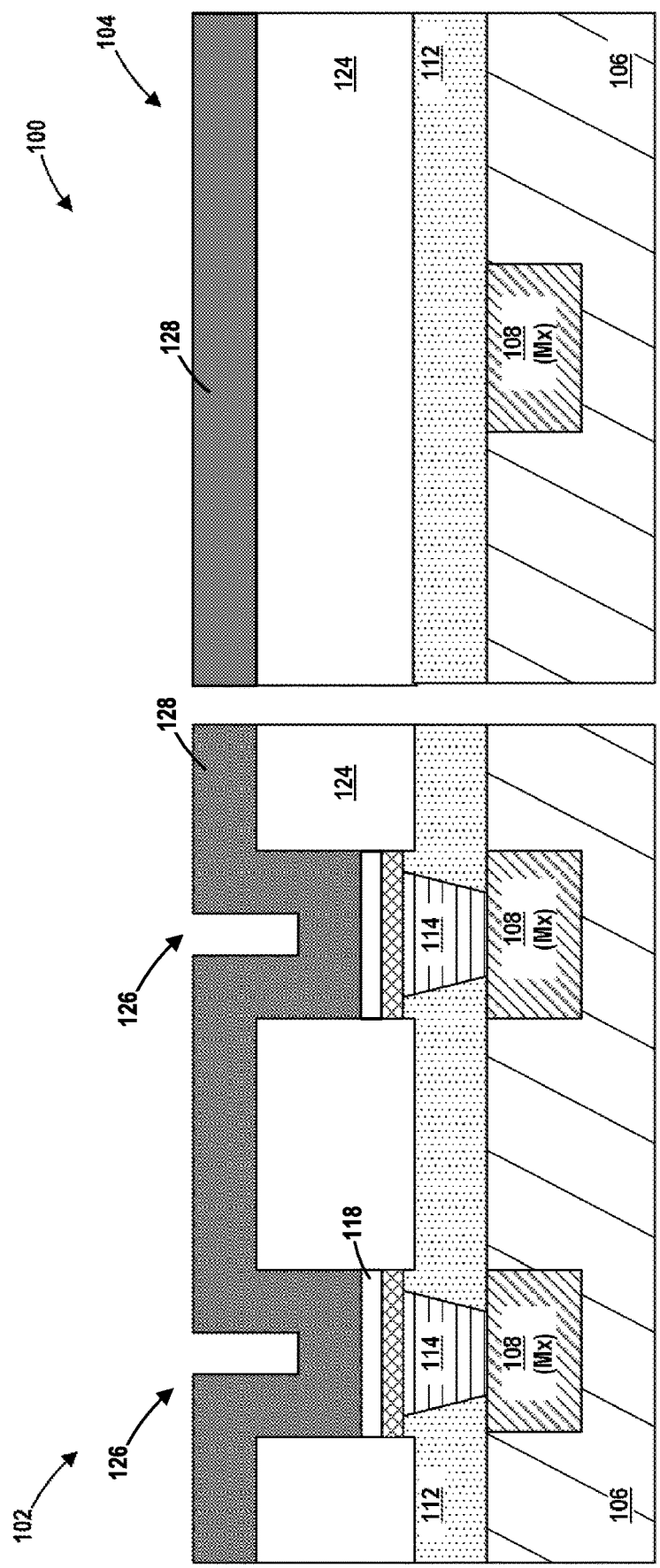

FIG. 6 depicts the IC product 100 after a conformal deposition process was performed to form a conformal layer of spacer material 128 across the product 100 and in the cavities 126. The layer of spacer material 128 may be of any desired thickness, e.g., 1-100 nm, and it may be comprised of any of a variety of different materials, e.g., SiN, SiCN, SiOCN, SiC, SiOC, $Al_2O_3$, amorphous silicon, etc. As will be described more fully below, in one illustrative process flow, the layer of spacer material 128 may be made relatively thick such that the top electrode 130 (described below) for the memory device 125 will occupy a relatively smaller volume of the cavity 126 as compared to the volume of the cavity 126 occupied by the internal sidewall spacer 128S. Moreover, using the methods and devices disclosed herein, the top electrode 130 may be substantially smaller, e.g., in terms of volume and/or physical dimensions (vertical height, lateral width, etc.), as compared to the top electrode on prior art memory cells.

Figure 7:
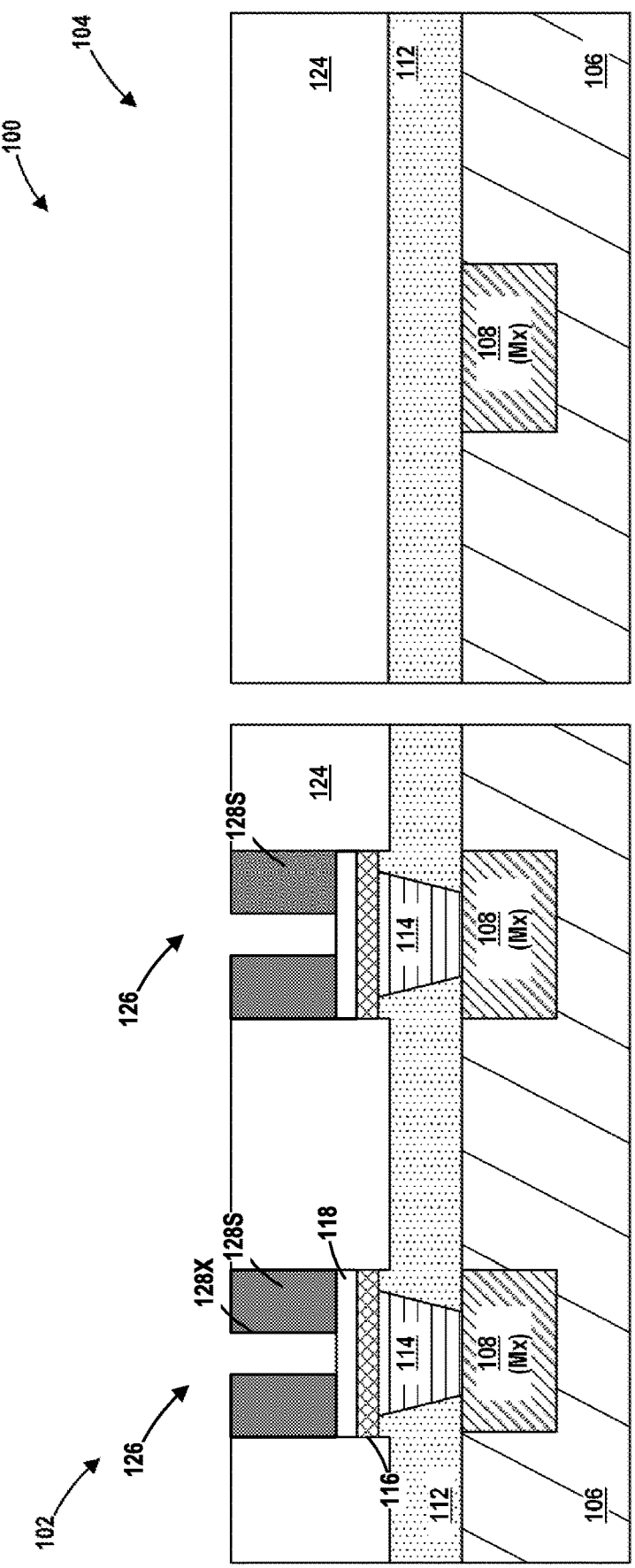

FIG. 7 depicts the product 100 after an anisotropic etching process was performed to remove horizontally positioned portions of the layer of spacer material 128. This etching process results in the formation of the above-mentioned internal sidewall spacer 128S in each of the cavities 126 above at least a portion of the layer of memory state material 118. In one particular example, the internal sidewall spacer 128S may be formed such that it is positioned on and in physical contact with an upper surface of the memory state material 118. The internal sidewall spacer 128S has a spacer opening 128X. The internal sidewall spacers 128S may be of any desired thickness (as measured at its base), e.g., 1-100 nm. In one particular embodiment, the thickness of the internal sidewall spacer 128S may be such that the spacer occupies approximately 10-90% of the volume of the cavity 126. In one particular embodiment, the thickness of the internal sidewall spacer 128S may be such that the spacer occupies at least 50% of the volume of the cavity 126.

Figure 8:
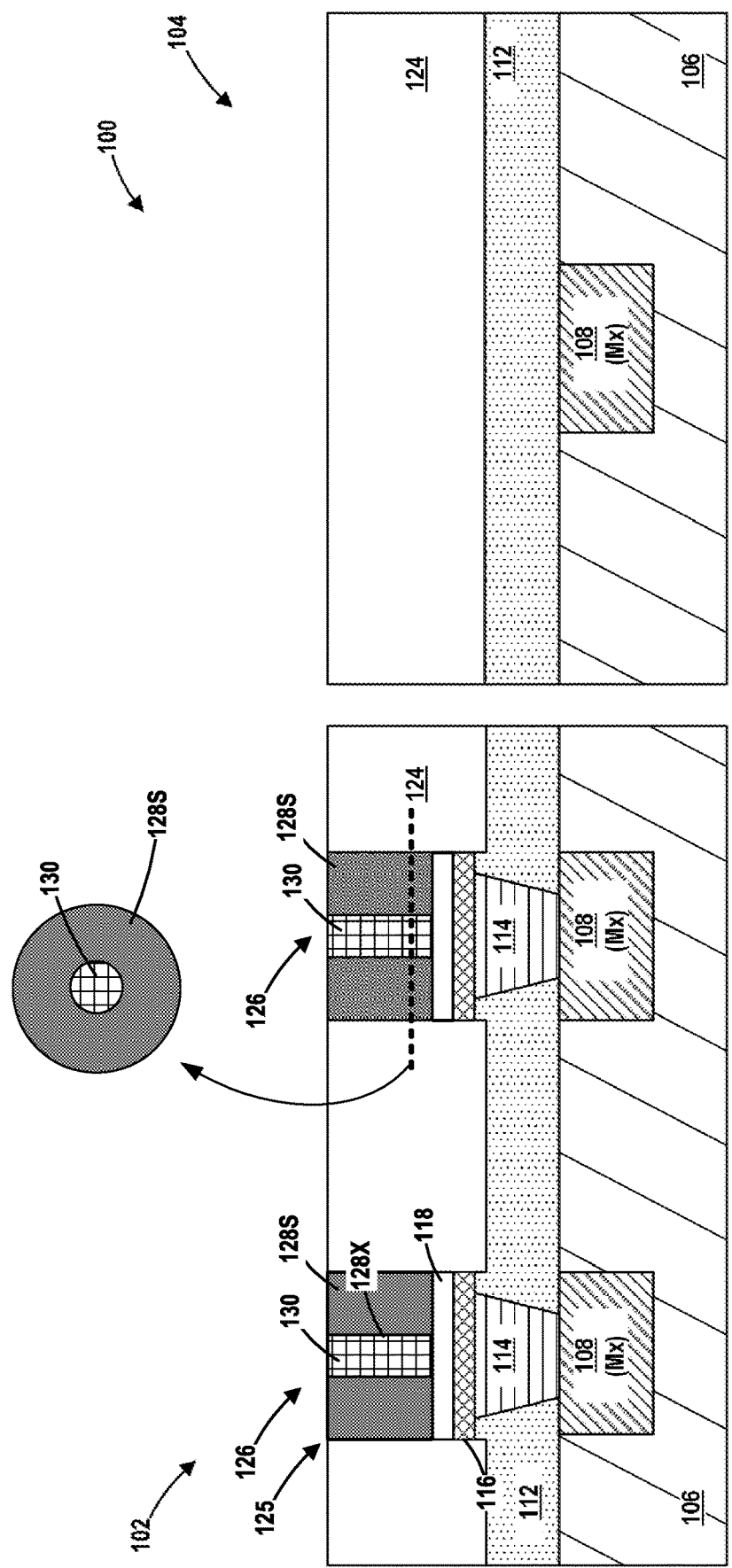

FIG. 8 depicts the product 100 after various operations were performed to form a top electrode 130 for the memory device 125 in the spacer opening 128X in each of the internal sidewall spacers 128S, e.g., the top electrode 130 is formed in the remaining portion of the volume of each of the cavities 126 that is not occupied by the internal sidewall spacer 128S. Then, a layer of conductive material (not shown) for the top electrode 130 was formed so as to overfill the spacer opening 128X in each of the internal sidewall spacers 128S, e.g., the remaining un-filled portions of the volume of the cavities 126. Thereafter, a CMP process may be performed to remove all of the layer of conductive material positioned above the upper surface of the layer of material 124 in both the memory region 102 and the logic region 104, thereby resulting in the formation of a top electrode 130 for each of the memory cells 125. As shown in FIG. 8, in one illustrative embodiment, when viewed from above, the portion of the top electrode 130 may have a substantially circular configuration. In other situations, the top electrode 130 may have a substantially oval configuration. The top electrode 130 may comprise any conductive material, e.g., copper, tungsten, ruthenium, aluminum, TaN, etc.

As mentioned above, in one illustrative embodiment, the top electrode 130 disclosed herein may be significantly smaller in size (in terms of volume and/or physical dimensions) as compared to top electrode structures on prior art memory cells. For example, in one embodiment, the combination of the internal sidewall spacer 128S and the top electrode 130 define a combined volume wherein the internal sidewall spacer 128S occupies a first portion of the combined volume and the top electrode 130 occupies a second portion of the combined volume, wherein the first portion is greater than the second portion. In some embodiments, the first portion—the portion of the combined volume occupied by the internal sidewall spacer 128S—is about 10-90% of the combined volume, and the second portion—the portion of the combined volume occupied by the top electrode 130—is at most about 10-90% of the combined volume according to memory cell design and performance request. Stated another way, the internal sidewall spacer 128S may occupy a first volume of the cavity 126 and the top electrode 130 may occupy a second volume of the cavity, wherein the first volume is greater than the second volume. When viewed from above, in the case where the internal sidewall spacer 128S has a substantially circular ring type structure, the internal sidewall spacer 128S may have an outer diameter of about several nanometers to several micrometers, while the diameter of the spacer opening 128X may be about 50% of the whole area. Similarly, when viewed from above, the top electrode 130 may be a substantially cylindrical type structure having a diameter several nanometers to several micrometers depending upon the desired performance characteristics of the memory cell. Of course, as will be appreciated by those skilled in the art after a complete reading of the present application, the internal sidewall spacer 128S and the top electrode 130 have a different configuration than that depicted in the drawings, e.g., they both may have a substantially square configuration when viewed from above.

By making the top electrode 130 disclosed herein relatively smaller than the top electrode on prior art memory cells, several benefits may be achieved. For example, the relatively smaller top electrode 130 disclosed herein is useful to confine the conduct filament with a localized electrical field in the memory cell 125, thereby leading to a memory cell with highly stable endurance and data retention capabilities.

Figure 9:
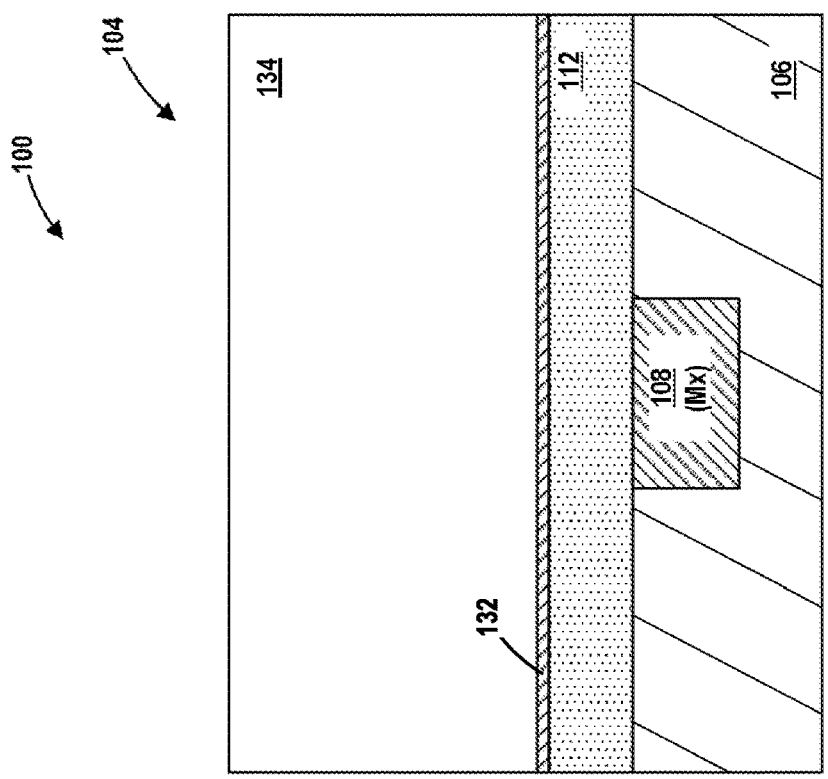
Figure 9:
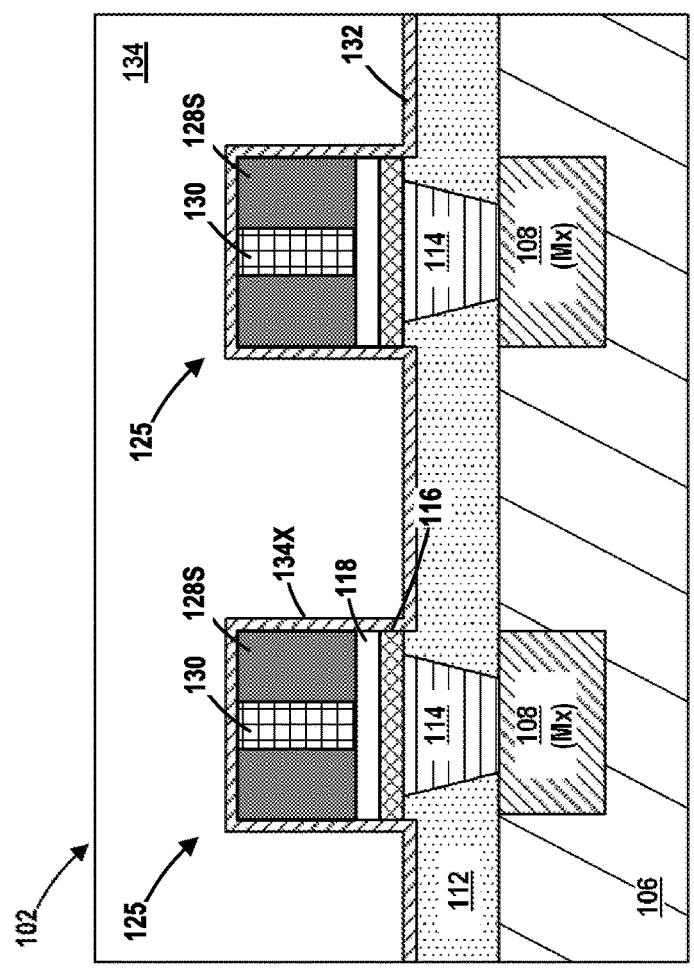

FIG. 9 depicts the IC product 100 after several process operations were performed. First, the layer of material 124 was removed. Thereafter, a conformal deposition process was performed to form a conformal encapsulation layer 132 across the product 100. The conformal encapsulation layer 132 may be of any desired thickness, e.g., several to hundreds of nanometers, and it may be comprised of any of a variety of different materials, e.g., SiN, SiC, SiCN, SiOCN, $Al_2O_3$, $HfO_x$, etc. Next, a representative layer of insulating material 134 was formed above the conformal encapsulation layer 132. The layer of insulating material 134 is intended to be representative in nature as it may in fact comprise multiple layers of material. The layer of insulating material 134 may be of any desired thickness, e.g., several to thousands of nanometers, and it may be comprised of any of a variety of different materials, e.g., $SiO_2$, a low-k material, etc. As depicted, each of the memory cells 125 is positioned in an opening 134X in the layer of insulating material 134

Figure 10:
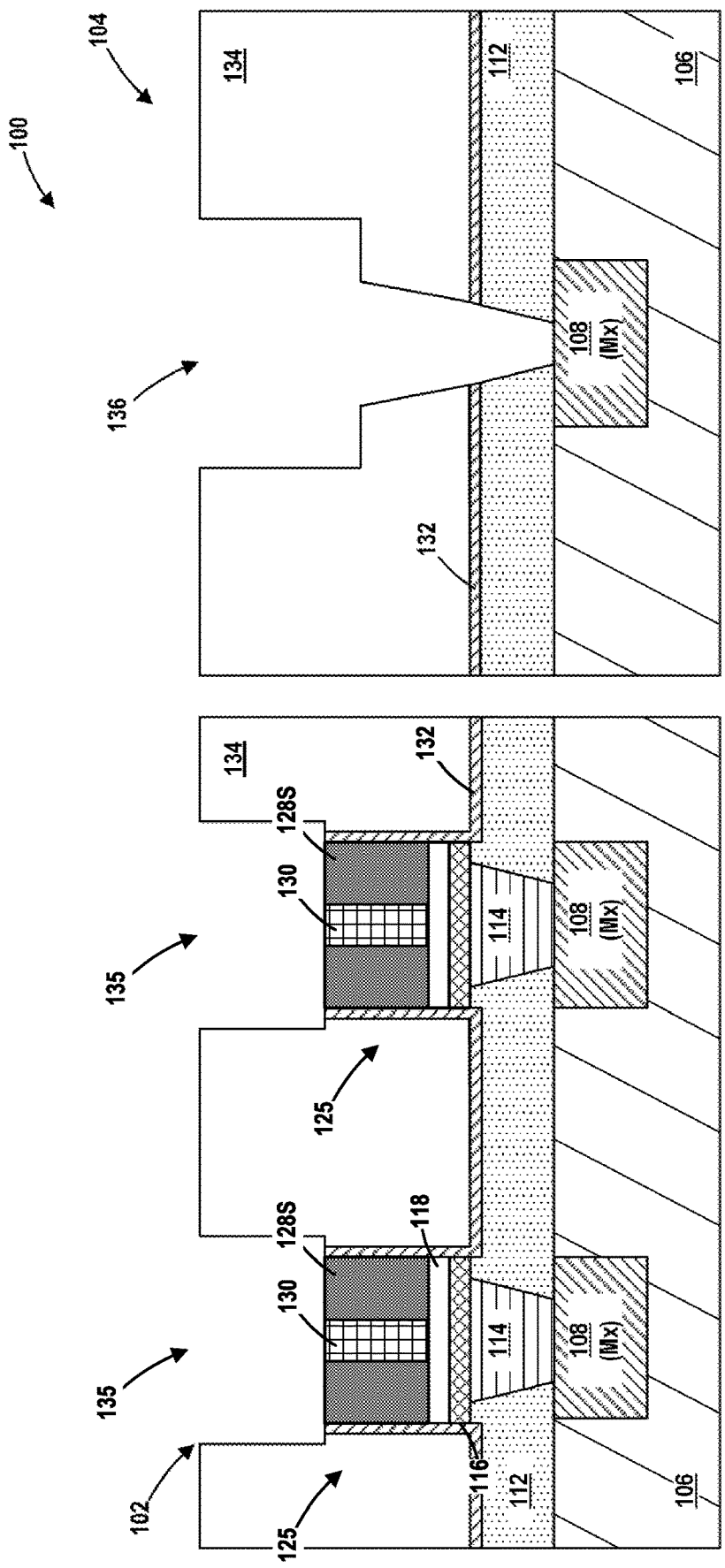

At the point of processing depicted in FIG. 9, various process operations may be performed to form various contact openings in the various layers of material for various conductive contact structures to be formed in the next metallization layer—Mx+1—of the IC product 100. As will be appreciated by those skilled in the art after a complete reading of the present application, there are several possible process flows for forming such conductive contacts. Accordingly, FIG. 10 depicts the product 100 after oner or more patterned etch masks (not shown) were formed above the product 100 and after various etching process operations were performed to form contact openings 135 for the memory cells 125 and a contact opening 136 in the logic region 104 for contacting the metal line 108 in the logic region 104. Note that part of the etching processes removes the portion of the conformal encapsulation layer 132 positioned above the top electrode 130 of each of the memory cells 125. However, the encapsulation layer 132 remains positioned around the outer perimeter of the memory cell 125 between the insulation material 134 and the memory cell 125. Each of the conductive contact openings 135 exposes the top electrode 130 of each of the memory cells 125. The conductive contact opening 136 exposes the metal line 108 in the logic region 104.

Figure 11:
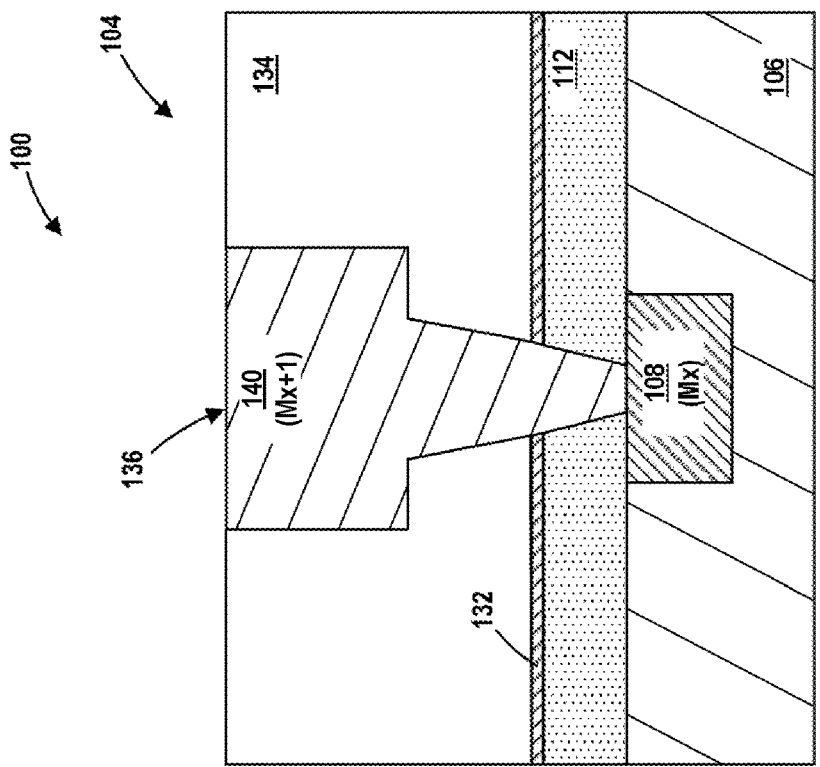
Figure 11:
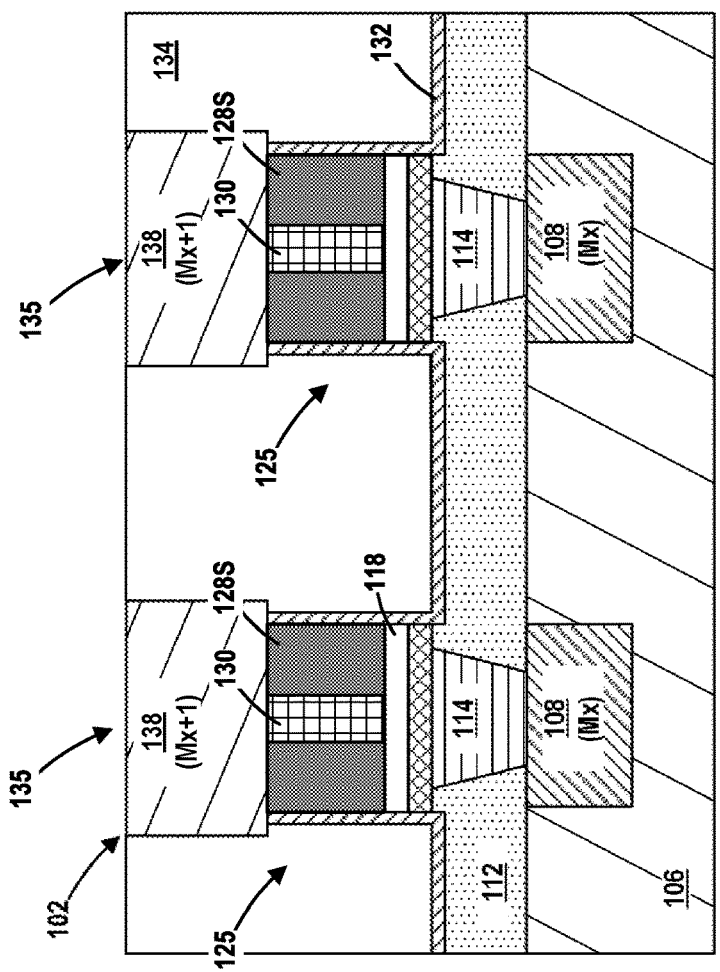

FIG. 11 depicts the product 100 after various process operations were performed to form a conductive contact structures 138 in each of the contact openings 135 and a conductive contact structure 140 in the contact opening 136. The conductive contact structures 138, 140 may be formed using a variety of techniques. In one example, various conformal liners and/or barrier layers may be formed in the trench/via openings. Thereafter, a conductive material, such as tungsten, may be deposited so as to overfill the remaining portions of the contact openings 135, 136. At that point, a CMP process operation may be performed to remove all conductive material positioned above the upper surface of the layer of insulating material 134. Note the conductive contact structure 138 is conductively coupled to the top electrode 130 and a portion of the conductive contact structure 138 is positioned on and in physical contact with an upper surface of the internal sidewall spacer 128S.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A device, comprising:
   a first layer of insulating material;
   a via in the first layer of insulating material; and
   a memory cell in a first opening within a second insulating layer above the first layer of insulating material, the memory cell above the via, the memory cell including:
      a bottom electrode above and in physical contact with the via, wherein the bottom electrode is within the first opening and above the first layer of insulating material;
      a memory state material above the bottom electrode;
      an internal sidewall spacer within the first opening, above at least a portion of the memory state material, and defining a spacer opening, the internal sidewall spacer including an upper surface perpendicular to opposing sidewalls and a bottommost surface having a first surface area; and
   a top electrode within the spacer opening and above a portion of the memory state material, the top electrode including a bottommost surface having a second surface area less than the first surface area,
   wherein the bottom electrode, the memory state material, and the internal sidewall spacer each have vertically aligned sidewalls.

2. The device of claim 1, further comprising a conductive contact structure that is conductively coupled to the top electrode wherein a portion of the conductive contact structure is on and in physical contact with an upper surface of the internal sidewall spacer, and
   wherein the internal sidewall spacer has a uniform vertical thickness.

3. The device of claim 1, wherein the at least one layer of insulating material comprises silicon dioxide, the internal sidewall spacer comprises silicon nitride and the memory cell comprises one of an MTJ (magnetic tunnel junction) memory device, an RRAM (resistive random access memory) device, a PRAM (phase-change random access memory) device, an MRAM (magnetic random access memory) device, or a FRAM (ferroelectric random access memory) device.

4. The device of claim 1, wherein the memory state material is on and in physical contact with the bottom electrode, the internal sidewall spacer is on and in physical contact with an upper surface of the memory state material, and the top electrode is on and in physical contact with the upper surface of the memory state material.

5. The device of claim 1, wherein the combination of the internal sidewall spacer and the top electrode define a combined volume, wherein the internal sidewall spacer occupies a first portion of the combined volume and the top electrode occupies a second portion of the combined volume, wherein the first portion is greater than the second portion.

6. The device of claim 5, wherein the second portion comprises less than 50% of the combined volume.

7. The device of claim 5, wherein the first portion comprises more than 50% of the combined volume.

8. The device of claim 1, wherein the bottom electrode comprises one of copper, tungsten, ruthenium, aluminum, Ta, Ti, TaN, or TiN, the memory state material comprises one of stoichiometric $ZrO_2$, ZnO, $HfO_2$, a doped metal oxide, a phase-change chalcoenide, a binary transition metal oxide, a perovskite, a solid-state electrolyte, an organic chart-transfer complex, an organic donor-acceptor system or a two dimension insulating material, and the top electrode comprises one of copper, tungsten, ruthenium, aluminum, Ta, Ti, TaN, or TiN.

9. The device of claim 1, wherein the top electrode is conductively coupled to the memory state material.

10. The device of claim 1, wherein the top electrode comprises a single layer of material.

11. The device of claim 1, further comprising an encapsulation layer around an outer perimeter of the memory cell and between the memory cell and the second layer of insulating material.

12. A device, comprising:
a first layer of insulating material;
a via in the first layer of insulating material; and
a memory cell in a first opening in a second layer of insulating material over the first layer of insulating material, the memory cell above the via, the memory cell including:
a bottom electrode above and in physical contact with the via, wherein the bottom electrode is within the first opening and above the first layer of insulating material;
a memory state material above the bottom electrode;
an internal sidewall spacer within the first opening above at least a portion of the memory state material, and defining a spacer opening, the internal sidewall spacer including an upper surface perpendicular to opposing sidewalls and a bottommost surface having a first surface area,
a top electrode within the spacer opening and above a portion of the memory state material, the top electrode including a bottommost surface having a second surface area less than the first surface area, and wherein the bottom electrode, the memory state material, and the internal sidewall spacer each have vertically aligned sidewalls.

13. The device of claim 12, further comprising a conductive contact structure that is conductively coupled to the top electrode and wherein a portion of the conductive contact structure is on and in physical contact with an upper surface of the internal sidewall spacer.

14. The device of claim 12, further comprising an encapsulation layer around an outer perimeter of the memory cell and between the memory cell and the at least one layer of insulating material.

15. The device of claim 12, wherein the memory state material is on and in physical contact with the bottom electrode, the internal sidewall spacer is on and in physical contact with an upper surface of the memory state material and the top electrode is on and in physical contact with the upper surface of the memory state material.

16. A method of forming a top electrode of a memory cell, the method comprising:
forming at least one first layer of insulating material;
forming a via in the at least one first layer of insulating material;
forming a stack of materials for the memory cell above the via, the stack of materials including:
a bottom electrode above and in physical contact with the via, wherein the bottom electrode is above the at least one layer of insulating material, and
a memory state material above the bottom electrode;
forming at least one second layer of insulating material around the stack of materials, the stack of materials for the memory cell being within a first opening of the at least one second layer of insulating material;
forming an internal sidewall spacer within the first opening, above at least a portion of the memory state material, and defining a spacer opening, the internal sidewall spacer being formed with an upper surface perpendicular to opposing sidewalls and a bottommost surface having a first surface area; and
forming a top electrode within the spacer opening and above a portion of the the memory state material, the top electrode including a bottommost surface having a second surface area less than the first surface area,
wherein the bottom electrode, the memory state material, and the internal sidewall spacer each have vertically aligned sidewalls.

17. The method of claim 16, wherein the stack of materials further comprises forming a layer of sacrificial top electrode material above the memory state material and wherein forming the first opening comprises, after forming the at least one second layer of insulating material, removing the layer of sacrificial top electrode so as to form the first opening, wherein the first opening exposes an upper surface of the memory state material.

18. The method of claim 16, wherein forming the internal sidewall spacer comprises:
forming a conformal layer of spacer material above the memory state material; and
performing an anisotropic etching process to remove horizontally oriented portions of the layer of spacer material so as to form the internal sidewall spacer within the cavity.

19. The method of claim 16, wherein the internal sidewall spacer occupies a first volume of the first opening and the top electrode occupies a second volume of the first opening, wherein the first volume is greater than the second volume.

20. The method of claim 16, wherein, after forming the top electrode, the method further comprises:
removing the at least one second layer of insulating material;
forming a conformal encapsulation layer around an outer perimeter of at least the internal sidewall spacer and above an upper surface of the top electrode;

forming at least one third layer of insulating material above the conformal encapsulation layer and above the upper surface of the top electrode;

forming a top electrode contact opening by performing at least one etching process to remove a portion of the at least one third layer of insulating material above the top electrode and to remove at least a portion of the conformal encapsulation layer above at least a portion of the top electrode so as to thereby expose an upper surface of the top electrode; and forming a conductive contact structure in the top electrode contact opening.

\* \* \* \* \*